United States Patent
Briggs et al.

(10) Patent No.: US 10,541,206 B2
(45) Date of Patent: Jan. 21, 2020

(54) INTERCONNECT STRUCTURE INCLUDING AIR GAPS ENCLOSED BETWEEN CONDUCTIVE LINES AND A PERMEABLE DIELECTRIC LAYER

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Christopher J. Penny, Saratoga Springs, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/479,983

(22) Filed: Apr. 5, 2017

(65) Prior Publication Data
US 2017/0278788 A1 Sep. 28, 2017

Related U.S. Application Data

(62) Division of application No. 15/076,878, filed on Mar. 22, 2016, now Pat. No. 9,837,355.

(51) Int. Cl.
*H01L 23/528* (2006.01)
*H01L 23/522* (2006.01)
(Continued)

(52) U.S. Cl.
CPC .... *H01L 23/5283* (2013.01); *H01L 21/02266* (2013.01); *H01L 21/02271* (2013.01);
(Continued)

(58) Field of Classification Search
CPC .............. H01L 21/764; H01L 21/7682; H01L 2221/1042–1047; H01L 2221/1047
See application file for complete search history.

(56) References Cited

U.S. PATENT DOCUMENTS

| 6,077,767 A | 6/2000 | Hwang |
| 6,117,742 A * | 9/2000 | Gardner ............ H01L 21/28114 257/E21.205 |

(Continued)

FOREIGN PATENT DOCUMENTS

WO 01/37339 A1 5/2001

OTHER PUBLICATIONS

Gosset, L.G. et al. "Multi-level Cu interconnects integration and characterization with air gap as ultra-low K material using a hybrid sacrificial oxide/polymer stack" Proc. IEEE IITC (2007) pp. 58-60.
(Continued)

*Primary Examiner* — Younes Boulghassoul
(74) *Attorney, Agent, or Firm* — Tutunian & Bitetto, P.C.; Vazken Alexanian

(57) ABSTRACT

A method of forming an interconnect to an electrical device is provided. The structure produced by the method may include a plurality of metal lines in a region of a substrate positioned in an array of metal lines all having parallel lengths; and a plurality of air gaps between the metal lines in a same level as the metal lines, wherein an air gap is present between each set of adjacent metal lines. A plurality of interconnects may be present in electrical communication with said plurality of metal lines, wherein an exclusion zone for said plurality of interconnects is not present in said array of metal lines.

7 Claims, 12 Drawing Sheets

(51) Int. Cl.
  *H01L 23/532* (2006.01)
  *H01L 21/764* (2006.01)
  *H01L 21/02* (2006.01)
  *H01L 21/3213* (2006.01)
  *H01L 21/768* (2006.01)
  *H01L 21/311* (2006.01)

(52) U.S. Cl.
  CPC ... *H01L 21/31111* (2013.01); *H01L 21/31116* (2013.01); *H01L 21/32133* (2013.01); *H01L 21/764* (2013.01); *H01L 21/7682* (2013.01); *H01L 21/7685* (2013.01); *H01L 21/76804* (2013.01); *H01L 21/76808* (2013.01); *H01L 21/76811* (2013.01); *H01L 21/76814* (2013.01); *H01L 21/76816* (2013.01); *H01L 21/76831* (2013.01); *H01L 21/76877* (2013.01); *H01L 21/76879* (2013.01); *H01L 21/76897* (2013.01); *H01L 23/522* (2013.01); *H01L 23/528* (2013.01); *H01L 23/5226* (2013.01); *H01L 23/5329* (2013.01); *H01L 23/53209* (2013.01); *H01L 23/53214* (2013.01); *H01L 23/53228* (2013.01); *H01L 23/53271* (2013.01); *H01L 23/53295* (2013.01); *H01L 21/76834* (2013.01); *H01L 21/76885* (2013.01); *H01L 23/53223* (2013.01); *H01L 23/53238* (2013.01); *H01L 23/53252* (2013.01); *H01L 23/53266* (2013.01)

(56) References Cited

U.S. PATENT DOCUMENTS

| | | | |
|---|---|---|---|
| 6,265,321 B1* | 7/2001 | Chooi | H01L 21/7682 257/E21.579 |
| 6,387,797 B1 | 5/2002 | Bothra et al. | |
| 6,555,467 B2* | 4/2003 | Hsu | H01L 21/76811 257/E21.579 |
| 6,780,753 B2 | 8/2004 | Latchford et al. | |
| 7,871,922 B2* | 1/2011 | Liu | H01L 21/7682 257/E21.581 |
| 8,456,009 B2 | 6/2013 | Su et al. | |
| 8,470,685 B2 | 6/2013 | Torres et al. | |
| 9,159,606 B1 | 10/2015 | Purayath et al. | |
| 9,281,277 B2 | 3/2016 | Baek et al. | |
| 9,553,019 B1 | 1/2017 | Briggs et al. | |
| 9,953,924 B2* | 4/2018 | Rha | H01L 21/306 |
| 2001/0016412 A1* | 8/2001 | Lee | H01L 21/76802 438/622 |
| 2004/0102031 A1 | 5/2004 | Kloster | |
| 2006/0088975 A1* | 4/2006 | Ueda | H01L 21/76801 438/421 |
| 2009/0001594 A1 | 1/2009 | Yoo et al. | |
| 2009/0302475 A1* | 12/2009 | Korogi | H01L 21/7682 257/761 |
| 2011/0076831 A1* | 3/2011 | Chen | H01L 21/76807 438/421 |
| 2013/0207269 A1 | 8/2013 | Oshida | |
| 2014/0151893 A1 | 6/2014 | Boyanov et al. | |
| 2015/0214092 A1 | 7/2015 | Purayath et al. | |
| 2015/0262912 A1* | 9/2015 | Ting | H01L 23/481 257/774 |
| 2015/0287628 A1 | 10/2015 | You et al. | |
| 2015/0287682 A1* | 10/2015 | Ahn | H01L 21/76835 257/773 |
| 2016/0093566 A1* | 3/2016 | Ting | H01L 23/5226 257/774 |
| 2016/0293547 A1* | 10/2016 | Rha | H01L 21/306 |
| 2016/0372415 A1* | 12/2016 | Siew | H01L 27/0886 |
| 2017/0194191 A1* | 7/2017 | Chen | H01L 21/7682 |
| 2017/0250104 A1* | 8/2017 | Singh | H01L 21/84 |

OTHER PUBLICATIONS

Gras, R. et al., "300 mm multi-level air gap integration for edge interconnect technologies and specific high performance applications" Proc. IEEE IITC (2008) pp. 196-198.

Hoofman, R., et al.,"Self-aligned multi-level air gap integration" Microelectronic engineering (2006) pp. 2150-2154, vol. 83, No. 11.

Noguchi, J. et al., "Misalignment-Free Air-Gap (MFAG) Interconnect with Via Base Structure for 45/65nm Node and Below" Proc. of the IEEE IITC (2006) pp. 167-169.

Ueda, T. et al., "A novel air gap integration scheme for multi-level interconnects using self-aligned via plugs" Proc. IEEE VLSI Technology Symposium (1998) pp. 46-47.

Pantouvaki, M. et al., "Air gap formation by UV-assisted decomposition of CVD material" Microelectronic Engineering (2008) pp. 2071-2074, vol. 85, No. 10.

Anonymous "A Structure and Method for bi-directionally self-aligned vias (bSAV)" IPCOM000201787D, (Nov. 23, 2010) pp. 1-3.

List of IBM Patents or Patent Applications Treated as Related dated Apr. 5, 2017, 2 pages.

U.S. Office Action issued in related U.S. Appl. No. 15/479,957, dated Jan. 4, 2018, pp. 1-32.

U.S. Final Office Action issued in related U.S. Appl. No. 15/650,344, dated Jul. 12, 2018, pp. 1-36.

Notice of Allowance issued in U.S. Appl. No. 15/650,344 dated Mar. 13, 2019, 10 pages.

U.S. Office Action issued in U.S. Appl. No. 15/479,957, dated Jun. 13, 2019, pp. 1-18.

* cited by examiner

INTERCONNECT STRUCTURE INCLUDING AIR GAPS ENCLOSED BETWEEN CONDUCTIVE LINES AND A PERMEABLE DIELECTRIC LAYER

BACKGROUND

Technical Field

The present invention relates to electrical devices, and more particularly, to interconnect structures in electrical devices.

Description of the Related Art

Back end of the line (BEOL) resistance and capacitance are important parameters in interconnect performance, typically documented as RC product. As the dimensions of electrical devices, such as semiconductor and memory devices, continue to scale, i.e., be reduced, the resistance typically increases exponentially, while the capacitance increases linearly (or remains constant through material changes). The interest in reducing the RC product has driven reducing the capacitance by reducing the dielectric constant of some of the dielectric materials being used in electrical devices.

SUMMARY

The present disclosure is directed to interconnects in electrical devices including air gap structures, and methods of forming interconnects to electrical devices including air gap structures. In one embodiment, the method may include forming a plurality of metal lines. At least one air gap is formed between adjacent metal lines in said plurality of metal lines by depositing a non-conformal material stack atop the plurality of metal lines, the material stack includes an air gap forming dielectric and a hard mask dielectric layer. A first interlevel dielectric layer is formed atop the material stack, wherein a trench is present in the interlevel dielectric exposing an apex of the non-conformal material stack substantially aligned to a metal line of the plurality of metal lines. An exposed portion of an apex portion of the hard mask dielectric layer is removed selectively to the air gap forming dielectric. A second trench is formed through the air gap forming dielectric using a remaining portion the hard mask dielectric layer as an etch mask to expose a metal line without opening said at least one air gap. A contact to the air gap is formed in at least the second trench.

In another embodiment, a method of forming an interconnect to an electrical device is provided that includes forming at least one air gap between adjacent metal lines in a plurality of metal lines, and forming a sacrificial filler material within the at least one air gap. A permeable cap dielectric is formed atop the sacrificial filler material. A contact is formed to a metal line of the plurality of metal lines. At least one of the permeable cap dielectric and the sacrificial filler material obstruct the contact from filling said at least one air gap. The sacrificial filler material is removed.

In another aspect of the present disclosure, an electrical device is provided that includes a plurality of metal lines in a region of a substrate positioned in an array of metal lines all having parallel lengths, and a plurality of air gaps between the metal lines in a same level as the metal lines. The air gaps are present between each set of adjacent metal lines. A plurality of interconnects are in electrical communication with the plurality of metal lines. An exclusion zone for said plurality of interconnects is not present in the array of metal lines.

In yet another aspect of the present disclosure, an electrical device is provided that includes a plurality of metal lines in a region of a substrate positioned in an array of metal lines all having parallel lengths; and a plurality of air gaps between the metal lines in a same level as the metal lines, wherein an air gap is present between each set of adjacent metal lines. The electrical device may further include a plurality of interconnects in electrical communication with said plurality of metal lines, in which the plurality of interconnects includes interconnects that are present extending over an air gap, but do not extend into the air gap. In some examples, the bottom surface of the interconnect provides a portion of an upper surface of the air gap. In some examples, a permeable dielectric cap is adjacent to the bottom surface of the interconnect and provides an abutting upper surface of the air gap adjacent to the upper surface of the air gap provided by the interconnect.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
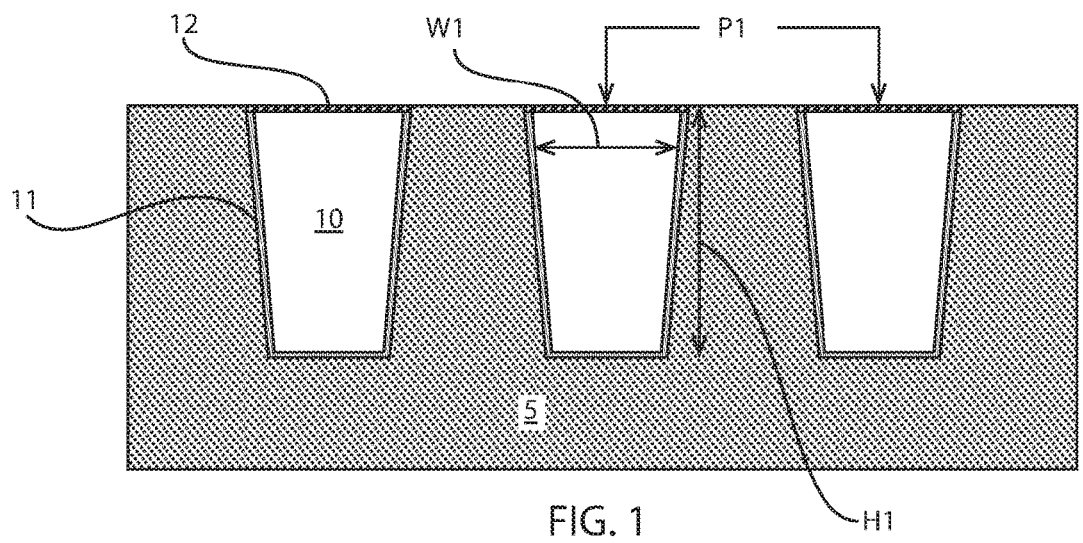
FIG. 1 is a side cross-sectional view depicting one embodiment of a plurality of metal lines, and forming a metal cap layer on an upper surface of the plurality of metal lines, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide a structure and method for maximizing air gap usage in back end of the line interconnects through via landing modification. Metal vias may also be referred to as contacts throughout the present disclosure.

BEOL resistance and capacitance are the critical parameters in interconnect performance, typically documented as the RC product. The need to minimize the RC product has driven the reduction in the capacitance through lowering of the dielectric constant. One solution for reducing the dielectric constant is the incorporation of air gaps between interconnects (k=1). Typically, air gap structures are carefully placed within circuits to prevent via structures from landing thereon, i.e., possibly from above, and entering an air gapped region, which can result in producing electrical shorts. This can lead to a reduction in total amount of air gaps that can be positioned within an electrical device, in which exclusion zones are positioned around areas in which vias are to land, reducing the effectiveness of the air gap structure. In some embodiments, the methods and structures disclosed herein create a fully aligned via compatible with maximized air gap utilization. In some embodiments, the methods and structures disclosed herein fill air gaps with a sacrificial material to prevent via landing shorts. In some embodiments, the methods and structures disclosed herein provide multilevel air gap structures, wherein the upper level via is fully aligned with and/or captured on an underlying barrier dielectric surface overlying the lower interconnect level, such that bridging of the misaligned upper level via to an air gap in the lower interconnect level is avoided. The methods and structures disclosed herein avoid interconnect to air gap misalignment without the use of restrictive via landing design rules that can restrict the location and area of the allowable air gap regions. The methods and structures of the present disclosure are now discussed with more detail referring to FIGS. 1-15.

FIGS. 1-10 depict one embodiment of a method for forming self-aligned and fully landed vias in a multi-level air gap interconnect structure leveraging the inherent topography of the air gap forming chemical vapor deposition (CVD) deposited dielectric, i.e., air gap forming dielectric 25. As will be further described below, the method includes the steps of depositing a non-conformal second level CVD dielectric, e.g., air gap forming dielectric 25, over an etched back first level interconnect, i.e., low-k dielectric layer 5 after the first level dielectric is removed from between the metal lines, such that pinched off air gaps 20 are formed in the first level with an overlying undulating surface topography in the second dielectric, e.g., air gap forming dielectric 25. This topography has high points, i.e., apexes, at locations above the first level interconnect lines, i.e., metal lines 10, and low points at the locations where air gaps 20 are located. In some embodiments, a two layer hard mask stack 30, 35 is formed on it, an organic planarizing layer (OPL) 51 is applied to fill the topography atop the hard mask stack 30, 35. A line level litho and etch is performed first to open a trench pattern in the top hard mask layer, then the organic planarizing layer (OPL) 51, and a via lithography process is done to form oversized via openings to a controlled depth in the organic planarizing layer (OPL) 51 such that the hard mask stack 30, 35 is only etched at the high points of the topography above the interconnect lines 10 (also referred to as metal lines 10) in the first level. The sec air gap forming dielectric 25 is etched to form the vias which are self-aligned and land atop the lower level interconnect lines only, i.e., metal lines 10 only. As the high points always exclude the location of the air gaps 20 in the level below, the method yields via landing that automatically excludes the underlying air gap locations.

FIG. 1 depicts one embodiment of a plurality of metal lines 10, and forming a metal cap layer 12 on an upper surface of the plurality of metal lines 10. The metal lines 10 may be arranged in an array configuration, in which the length of the adjacent metal lines 10 runs substantially parallel to one another. The metal lines 10 can provide electrical communication horizontally across an electrical device from one region of the electrical device to another, and can also be in communication with vias that bring the electrical signals to the interconnects and related structures across the electrical device.

The metal lines 10 may be composed of any electrically conductive material. For example, the metal lines 10 may be composed of copper, silver, platinum, aluminum, gold, tungsten and combinations thereof. In other embodiments, the metal lines 10 may be composed of an n-type semiconductor material, such as n-type polysilicon. The metal lines 10 may have a height H1 ranging from 20 nm to 1000 nm, and a width W1 ranging from 5 nm to 500 nm. In another embodiment, the metal lines 10 may have a height H1 ranging from 20 nm to 100 nm, and a width W1 ranging from 10 nm to 80 nm. The pitch P1 separating the adjacent metal lines may range from 20 nm to 1000 nm. In another embodiment, the pitch P1 may range from 30 nm to 80 nm. In yet another embodiment, the pitch P1 may range from 40 nm to 50 nm.

The metal lines 10 may be formed in trenches that are forming in a low-k dielectric layer 5 that is overlying a substrate (not shown). The substrate may include a semiconductor wafer, such as a type IV semiconductor wafer, e.g., silicon wafer, or a type III-V semiconductor wafer, such as a compound semiconductor, e.g., gallium arsenide semiconductor wafer. In one embodiment, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer may also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

The low-k dielectric layer 5 can be present atop the above described substrate. The term "low-k" denotes a material having a dielectric constant that is less than the dielectric constant of silicon dioxide ($SiO_2$). For example, a low-k dielectric material for the intralevel dielectric layer 10 may have a dielectric constant that is less than 4.0, e.g., 3.9. In one embodiment, the low-k dielectric material may have a dielectric constant ranging from 1.75 to 3.5. In another embodiment, the low-k dielectric layer 5 may have a dielectric constant ranging from 2.0 to 3.2. In yet an even further embodiment, the low-k dielectric layer 5 may have a dielectric constant ranging from 2.25 to 3.0. Examples of materials suitable for the low-k dielectric layer 5 may include organosilicate glass (OSG), fluorine doped silicon dioxide, carbon doped silicon dioxide, porous silicon dioxide, porous carbon doped silicon dioxide, spin-on organic polymeric dielectrics (e.g., SILK.™), spin-on silicone based polymeric dielectric (e.g., hydrogen silsesquioxane (HSQ) and methylsilsesquioxane (MSQ), and combinations thereof.

In some embodiments, the plurality of metal lines 10 may be formed in the low-k dielectric layer 5 by a process sequence that includes forming a plurality of line trenches in a low-k dielectric layer, forming a liner material 11 in the line trenches, and forming the plurality of metal lines 10 on the liner material 11 in the line trenches. The line trenches may be formed by forming a photoresist mask on the upper surface of the low-k dielectric layer 5, and etching the low-k dielectric layer 5 using an etch process, such as reactive ion etch. The liner material 11 is typically a conformal layer, and is typically formed on the sidewalls and base of the line trenches. The term "conformal" denotes a layer having a thickness that does not deviate from greater than or less than 30% of an average value for the thickness of the layer. The liner material 11 may be a seed layer for forming the material for the metal lines 10. Examples of compositions for the seed layer may be metals, such as copper or aluminum. The liner material 11 may also be a diffusion barrier, such as a metal nitride, e.g., tantalum nitride, tungsten or titanium nitride. The liner material 11 may be formed using chemical vapor deposition (CVD), atomic layer deposition (ALD), or physical vapor deposition (PVD), and can have a thickness ranging from 1 nm to 10 nm, and in some examples having a thickness ranging from 2 nm to 5 nm. Examples of CVD suitable for forming the liner material 11 include plasma enhanced CVD (PECVD). Examples of PVD suitable for forming the liner material 11 include plating, electroplating, electroless plating, sputtering and combinations thereof. The metal lines 10 may be deposited to fill the line trenches. The metal lines may be formed using chemical vapor deposition (CVD), e.g., plasma enhanced CVD (PECVD); atomic layer deposition (ALD), or physical vapor deposition (PVD), e.g., plating, electroplating, electroless plating, sputtering and combinations thereof. A planarization process may be applied to the upper surface of the deposited material for the metal lines, so that the upper surfaces of the metal lines are coplanar with the upper surface of the low-k dielectric layer 5.

FIG. 1 also depicts selectively forming a metal cap layer 12 on an upper surface of the plurality of metal lines 10. By selectively formed it is meant that the deposition process for forming the metal cap layer 12 deposits the metal material for the metal cap layer 12 only on the upper surface of the metal lines 10 without forming the metal material on the upper surface of the low-k dielectric material 5. The metal cap layer 12 may be composed of cobalt (Co), tungsten (W) and ruthenium (Ru). The metal cap layer 12 may have a thickness ranging from 1 nm to 10 nm, and in some examples may range from 2 nm to 5 nm. The metal cap layer 12 may be deposited using a chemical vapor deposition (CVD) apparatus or an atomic layer deposition (ALD) apparatus. Further details regarding the selective forming for the material of the metal cap layer 12 may be found in U.S. Pat. Nos. 4,517,225, 4,853,347 and U.S. Patent Application Publication No. 2009/0269507, which are incorporated herein by reference.

Figure 2:
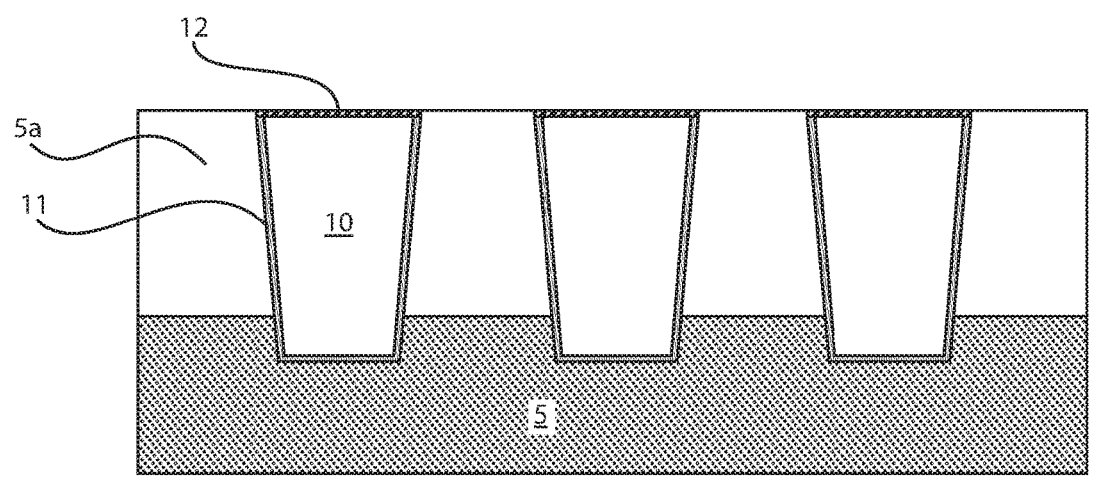
FIG. 2 is a side cross-sectional view depicting damaging a portion of a low-k dielectric material that is separating adjacent metal lines, in accordance with one embodiment of the present disclosure.

FIG. 2 depicts damaging a portion of a low-k dielectric material 5 that is separating adjacent metal lines 10. The damage step may be provided by a plasma operation that removes the carbon from the low-K dielectric layer 5. The plasma may include an oxygen plasma, an ammonia plasma, nitrogen or hydrogen plasma. The plasma process is continued until a thickness of the low-k dielectric layer 5 extending substantially to the base of the metal lines 10 is damaged (identified by damaged portion 5a).

Figure 3:
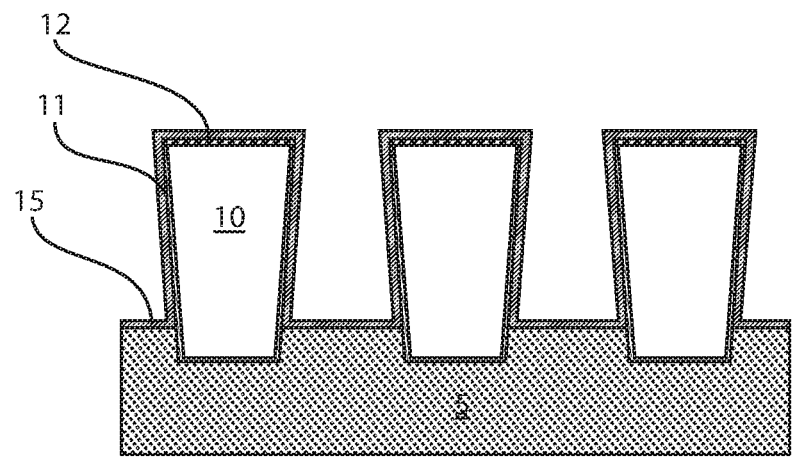
FIG. 3 is a side cross-sectional view depicting removing the damaged portion of the low-k dielectric and forming a conformal dielectric layer on sidewalls and upper surfaces of said plurality of metal lines, in accordance with one embodiment of the present disclosure.

FIG. 3 depicts one embodiment of removing the damaged portion 5a of the low-k dielectric 5, and forming a conformal dielectric layer 15 on sidewalls and upper surfaces of said plurality of metal lines 10. The damaged portion 5a of the low-k dielectric 5 can be removed by an etch process that is selective to the portion of the low-k dielectric 5 that has not been damaged. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for removing the damaged portion 5a of the low-k dielectric 5 may also be selective to the metal cap layer 12. In some embodiments, the damaged portion 5a of the low-k dielectric 5 may be removed using a wet or dry etch process. In one embodiment, the damaged portion 5a of the low-k dielectric 5 is removed by reactive ion etch (RIE). Removing the damaged portion 5a of the low-k dielectric 5 forms a space between adjacent metal lines.

The conformal dielectric layer 15 may be a continuous layer that extends across the entire substrate, and is present on the sidewall surfaces and upper surface of the metal lines 10, as well as the portion of the low-k dielectric 5 present in the space between the metal lines 10 on the low-k dielectric 5. The conformal dielectric layer 15 may be composed of an oxide, nitride, or oxynitride material. For example, when the conformal dielectric layer 15 is composed of a nitride, the conformal dielectric layer 15 may be silicon nitride. The conformal dielectric layer 15 may have a thickness ranging from 1 nm to 10 nm. In some embodiments, the conformal dielectric layer 15 has a thickness ranging from 2 nm to 5 nm. The conformal dielectric layer 15 may be formed using chemical vapor deposition, such as plasma enhanced CVD (PECVD), or atomic layer deposition (ALD).

Figure 4:
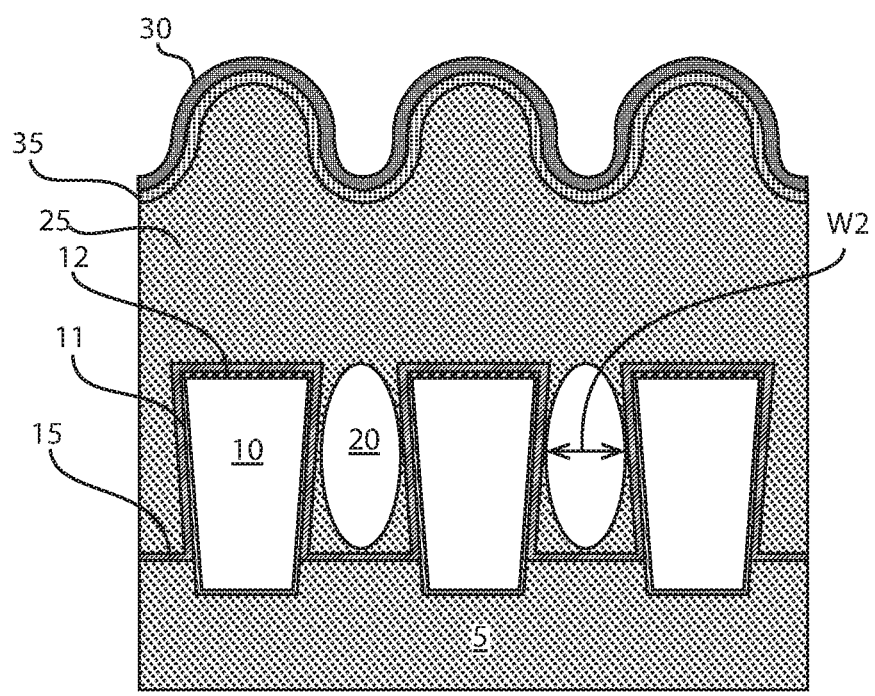
FIG. 4 is a side cross-sectional view depicting one embodiment of forming at least one air gap between adjacent metal lines in the plurality of metal lines by depositing a non-conformal material stack atop the plurality of metal lines, wherein the material stack includes an air gap forming dielectric and a hard mask dielectric layer, in accordance with the present disclosure.

FIG. 4 depicts one embodiment of forming at least one air gap 20 between adjacent metal lines 10 in the plurality of metal lines by depositing a non-conformal material stack 25, 30, 35 atop the plurality of metal lines 10. In some embodiments, the material stack includes an air gap forming dielectric 25 and a hard mask dielectric layer 30, 35. The air gap forming dielectric 25 is typically non-conformally deposited and encloses the air gaps 20 within said space between said adjacent lines 10 by pinching off the opening to the space. The air gap forming dielectric 25 is typically composed of a low-k dielectric. Examples of materials suitable for the low-k dielectric material that provides air gap forming dielectric 25 may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof.

The air gap forming dielectric 25 is deposited using process that can provide a poor step coverage that can produce the undulating upper surface that is depicted in FIG. 4. The undulating upper surface is characterized by alternative apexes and recesses in a wave like geometry. The apexes of the upper surface of the air gap forming dielectric 25 are aligned, i.e., self-aligned, to be centered over the metal lines 10, and the recessed portion of the upper surface of the air gap forming dielectric 25 are aligned to the air gaps 20. The thickness of the air gap forming dielectric 25 can be selected to ensure encapsulation of the air gaps 20. The air gaps 20 typically have a width W2 ranging from 10 nm to 500 nm.

Referring to FIG. 4, in some embodiments, the hard mask dielectric layer is composed of a bilayer of a nitride containing dielectric 35 present on the low-k dielectric air gap forming dielectric 25, and a metal nitride 30 that is present atop the nitride containing dielectric 35. In some embodiments, the material layers that provide the hard mask dielectric are conformally formed layers, which are formed entirety atop the undulating surface of the air gap forming dielectric 25. For example, the nitride containing dielectric 35 may be silicon nitride, and have a thickness ranging from 1 nm to 10 nm. In some embodiments, the nitride containing dielectric 35 has a thickness ranging from 2 nm to 5 nm. The nitride containing dielectric 35 may be formed using chemical vapor deposition, such as plasma enhanced CVD (PECVD), or atomic layer deposition (ALD).

The metal nitride layer 30 can be a conformally formed layer. The metal nitride layer 30 may be composed of a metal nitride that is selected from the group consisting of titanium nitride, tantalum nitride, tungsten nitride and a combination thereof. The metal nitride layer 30 may have a thickness ranging from 1 nm to 10 nm. In another embodiment, the metal nitride layer 30 may have a thickness ranging from 2 nm to 5 nm. The metal nitride layer 30 may be formed using chemical vapor deposition (CVD), such as plasma enhanced CVD (PECVD); atomic layer deposition (ALD); or physical vapor deposition (CVD), such as sputtering and plating.

Figure 5:
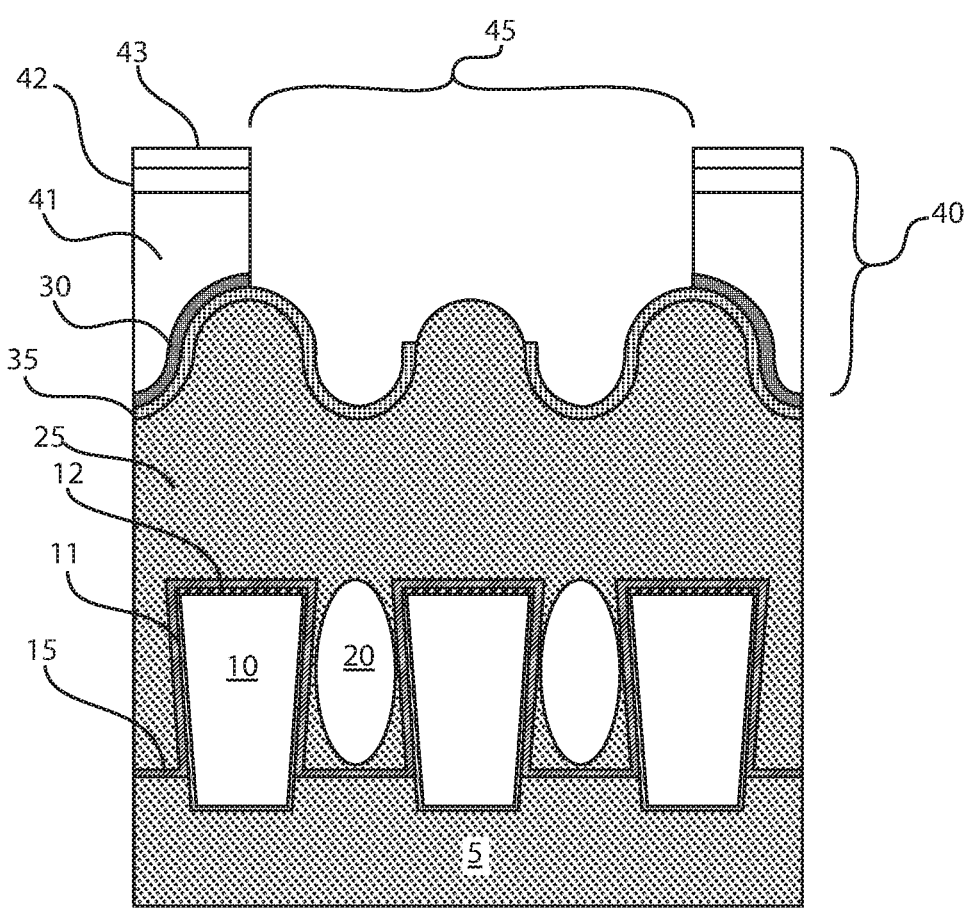
FIG. 5 is a side cross-sectional view depicting one embodiment of forming a first etch mask over a bilayer of a metal nitride layer and a nitride containing dielectric that provides the hard mask dielectric layer, wherein an opening in the etch mask is overlying at least one of said metal lines and at least one of said air gaps, and removing an exposed portion of the metal nitride layer in said opening selectively to the nitride containing dielectric of the bilayer, in accordance with the present disclosure.

FIG. 5 depicts one embodiment of forming a first etch mask 40 over a bilayer of the metal nitride layer 30 and the nitride containing dielectric layer 35 that provides the hard mask dielectric layer, wherein an opening 45 in the etch mask 40 is overlying at least one of said metal lines and at least one of said air gaps. Forming the etch mask 40 may begin with forming an organic planarization layer (OPL) 41. The organic planarization layer (OPL) 41 may be an organic polymer, such as polyacrylate resin, epoxy resin, phenol resin, polyamide resin, polyimide resin, unsaturated polyester resin, polyphenylenether resin, polyphenylenesulfide resin, or benzocyclobutene (BCB). The opening 45 may be formed through the OPL layer using photolithography and etch processes. For example, an antireflective coating 42, e.g., SiARC, may be formed atop the OPL layer 41, followed by a photoresists mask 43. For example, a photoresist mask 43 may be formed overlying the OPL layer 41 using deposition and photolithography, in which the openings in the photoresist mask correspond to the portions of the OPL layer 41 that are etched to provide the opening 45. More specifically, in one embodiment, a photoresist pattern (also referred to as photoresist mask) is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The exposed portions of OPL layer 41 may then be etched to provide the opening 45 using the photoresist mask 43 as an etch mask. The etch process for forming the opening 45 may include an anisotropic etch, such as reactive ion etch, laser etching, plasma etching, or a combination thereof.

FIG. 5 depicts one embodiment of removing an exposed portion of the metal nitride layer 30 exposed by the opening 45 selectively to the nitride containing dielectric 35 of the bilayer that provides the hard mask. The etch process for removing the exposed portion of the metal nitride layer 30 may be selective to the nitride containing dielectric 34 and the OPL layer 41. The etch process for removing the exposed portion of the metal nitride layer 30 may be a wet etch process, or a dry etch, e.g., gas plasma etching or reactive ion etch.

Following removal of the exposed portion of the metal nitride layer 30, the OPL layer 41, the SiARC layer 42 and the photoresist mask 43 may be stripped from the structure depicted in FIG. 5. In some embodiments, the metal nitride layer 30, the OPL layer 41, the SiARC layer 42 and the photoresist mask 43 are removed using a selective etch, such as a wet chemical etch.

Figure 6:
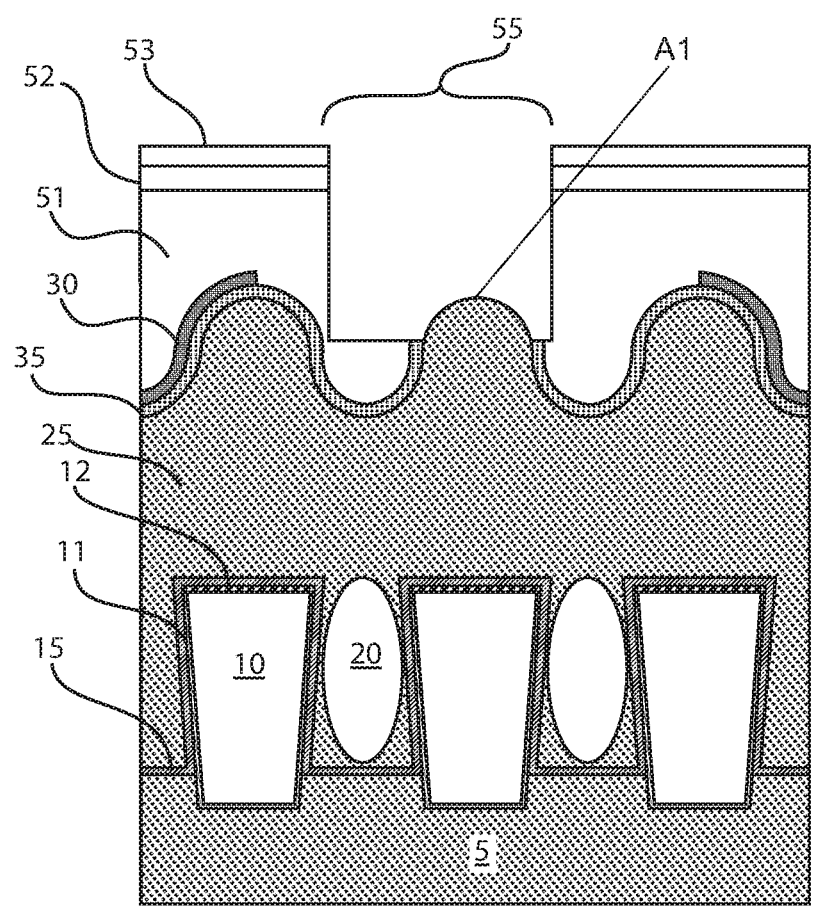
FIG. 6 is a side cross-sectional view depicting one embodiment of forming an interlevel dielectric layer atop the material stack, wherein an opening is present in the interlevel dielectric exposing an apex of the non-conformal material stack substantially aligned to a metal line of the plurality of metal lines, and removing an exposed portion of an apex portion of the hard mask dielectric layer selectively to the air gap forming dielectric, in accordance with the present disclosure.

FIG. 6 depicts one embodiment of forming a sacrificial dielectric layer 51 atop the material stack 30, 35, wherein an opening 55 is present in the sacrificial dielectric 51 exposing an apex A1 of the non-conformal material stack substantially aligned to a metal line 10 of the plurality of metal lines. The sacrificial dielectric layer 51 may be composed of an organic planarization layer (OPL) 51 that is similar to the organic planarization layer 41 described above with reference to FIG. 5. Therefore, in some embodiments, the above description of the organic planarization layer 41 depicted in FIG. 4 may provide an example for one embodiment of a sacrificial dielectric layer 51, as depicted in FIG. 5. The opening 55 is formed in the sacrificial dielectric layer 51 using deposition, photolithography and etch processes. For example, a photoresist etch mask 53 and antireflective coating 52 may be used in combination with an etch process, such as reactive ion etch, may be used to form the opening 55. The width of the opening 55 exposes the nitride containing dielectric layer 35 that is present on the apex A1 of the undulating upper surface of the air gap forming dielectric 25 that is aligned with the underlying metal line 20, while a remaining portion of the nitride containing dielectric layer 35 is covered by a remaining portion of the sacrificial dielectric layer 51.

The depth of the opening 55 is selected so that the opening only exposes the nitride containing dielectric layer 35 that is present on the apex A1 of the undulating surface of the air gap forming dielectric 25, but the depth of the opening 55 does not extend to expose the portions of the nitride containing dielectric layer 35 that is present on the recessed portions of the undulating surface of the air gap forming dielectric 25. The etch process for forming the opening 55 may be an anisotropic etch. As used herein, the term "anisotropic etch process" denotes a material removal process in which the etch rate in the direction normal to the surface to be etched is greater than in the direction parallel to the surface to be etched. The anisotropic etch process that provides the opening 55 may be a reactive ion etch (RIE) process. Other examples of anisotropic etching that can be used at this point of the present disclosure include ion beam etching, plasma etching or laser ablation. To determine the depth of the opening 55 that exposes only the apex portions of the nitride containing dielectric layer 35, the etch process for forming the opening 55 may be timed. In other embodiments, end point detection methods may be used to terminate the etch process for forming the opening 55.

FIG. 6 depicts one embodiment of removing an exposed portion of an apex portion of the hard mask dielectric layer, i.e., the apex portion of the nitride containing dielectric layer 35, selectively to the air gap forming dielectric 25 and the sacrificial dielectric layer 51. The etch process for removing the exposed portions of the nitride containing dielectric layer 35 that is present on the apex portion of the air gap forming dielectric 25 may be a wet etch process or a dry etch process. Examples of dry etch processes suitable for being employed at this stage of the present disclosure may include reaction ion etching or gas plasma etching.

Figure 7:
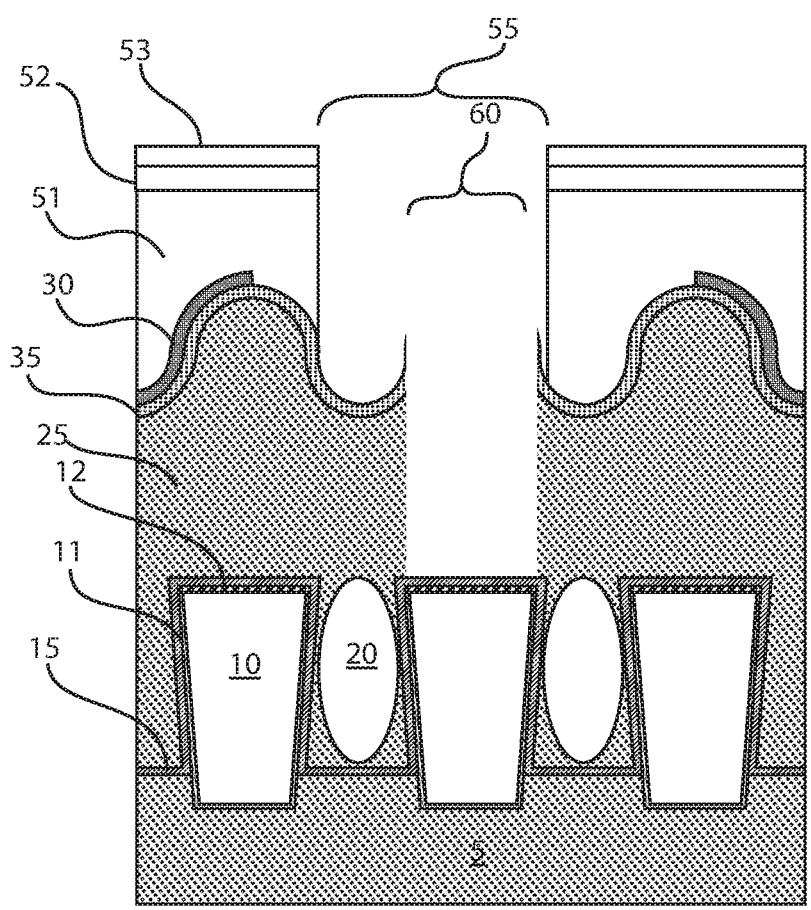
FIG. 7 is a side cross-sectional view depicting one embodiment of forming a trench through the air gap forming dielectric using a remaining portion the hard mask dielectric layer as an etch mask to expose a metal line without opening said at least one air gap, in accordance with the present disclosure.

FIG. 7 depicts one embodiment of forming a trench 60 through the air gap forming dielectric 25 using a remaining portion the photoresist mask 53 and the patterned portion, i.e., opening 55, of the sacrificial dielectric layer 51 as an etch mask to expose a metal line 10. Because the trench 60 is formed using an anisotropic etch that removes the exposed air gap forming dielectric 25, and the exposed air gap forming dielectric 25 is aligned to an underlying metal line 10, the trench 60 is aligned to the underlying metal line 10. The exposed air gap forming dielectric 25 is aligned to the underlying metal line 10, because the exposed air gap forming dielectric 25 is the apex portion of the undulating upper surface of the air gap forming dielectric, which is aligned to the metal lines 10. The etch process for forming the trench 60 may also be selective to the metal cap layer 12 atop the metal lines 10. The etch process for forming the trench 60 may be provided by reactive ion etch (RIE). Other examples of anisotropic etching that can be used at this point of the present disclosure include ion beam etching, plasma etching or laser ablation.

Figure 8:
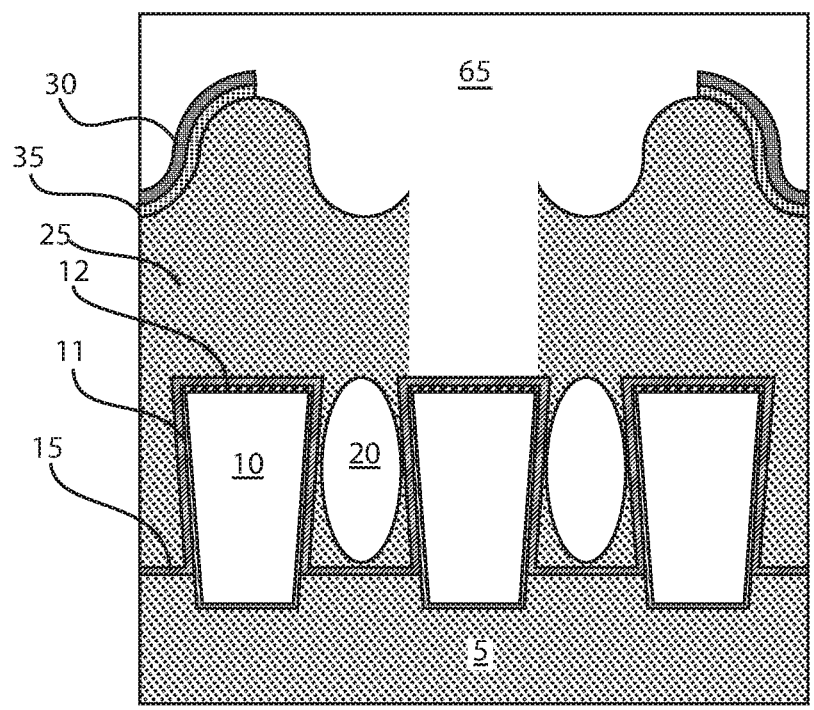
FIG. 8 is a side cross-sectional view depicting filling the trenches with a plug material prior to forming the contact to the metal line.

FIG. 8 depicts filling the trenches 60 with a plug material 65 prior to forming the contact to the metal line. Before filling the trenches, the photoresist mask 53, antireflective coating 52 and the sacrificial dielectric layer 51 may be removed. Thereafter, the exposed portion of the nitride containing dielectric layer 35 may be remove by an etch that is selective to the remaining portion of the metal nitride layer 30 and the sacrificial dielectric layer 51. The trench 60 may then be filled with a via plug material, such as SiARC or organo-siloxane (RxCH3ySiOz) polymer (R=organic chromophore)(marketed under the tradename DUO from Honeywell. In other examples, the via plug material may be composed of organic dielectric materials that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly(naphthalenes), poly(norbornenes), foams of polyimides, organic xerogels, porous PTFE and other nano-, micro- or macroporous organic materials. The plug material 65 may be deposited using chemical vapor deposition, solution deposition or spin on deposition. Following deposition, the plug material 65 may be planarized, e.g., by chemical mechanical planarization (CMP), to provide the structure depicted in FIG. 8.

Figure 9:
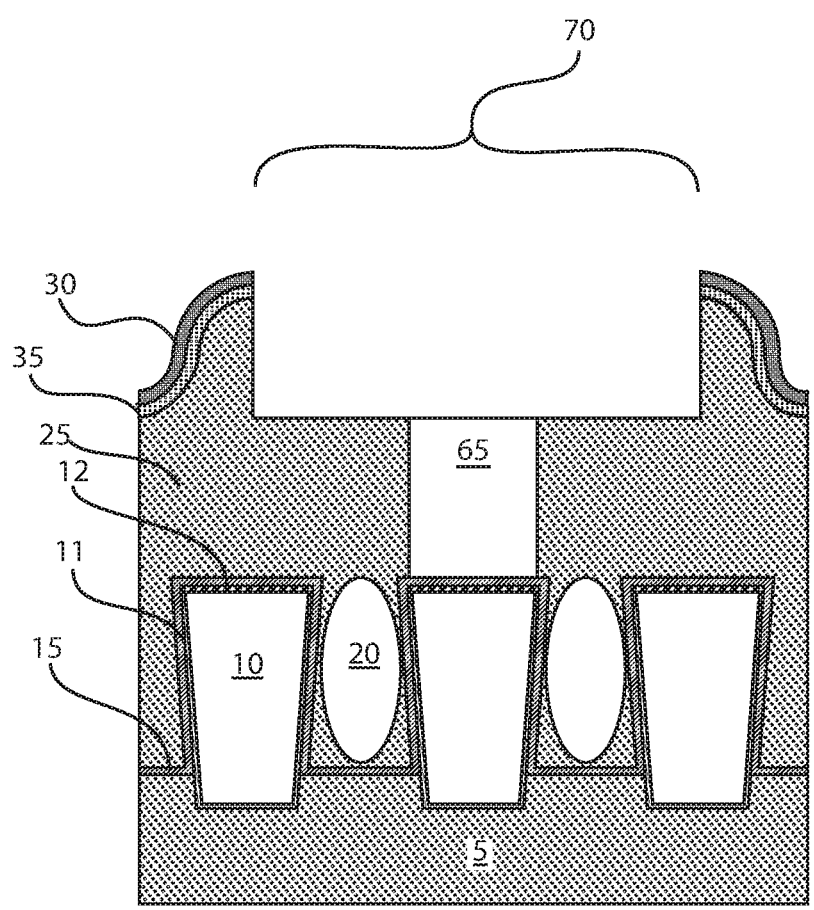
FIG. 9 is a side cross-sectional view depicting recessing the plug material to expose the remaining portion of the hard mask for removal by etching, in accordance with one embodiment of the present disclosure.

FIG. 9 depicts one embodiment of recessing the plug material 65 to expose the remaining portion of the hard mask 30, 35 for removal by etching. The plug material 65 may be recessed by an etch that includes wet chemical etching or reactive ion etching. The remaining portion of the hard mask 30, 35 may be removed by an etch process that is selective to the air gap forming dielectric 25.

Figure 10:
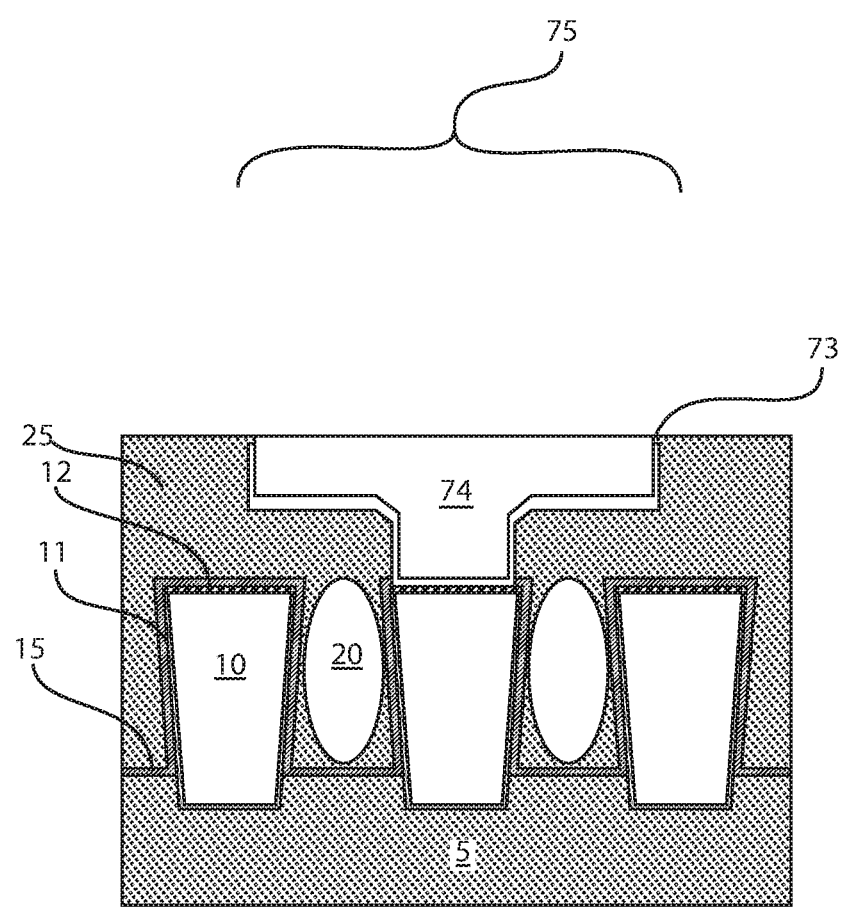
FIG. 10 is a side cross-sectional view depicting forming a contact to the metal lines, in accordance with one embodiment of the present disclosure.

FIG. 10 depicts forming a contact 75 to the metal lines 10. Forming the contact 75 may include forming a contact liner 73 followed by an electrically conductive fill material 74. The contact liner 73 may be a seed layer, diffusion barrier or adhesion layer that can be deposited using at least one of atomic layer deposition (ALD), chemical vapor deposition (CVD), plasma vapor deposition (PVD), pulsed nucleation layer (PNL), pulsed deposition layer (PDL), plasma-enhanced ALD and plasma-enhanced CVD. The contact liner 73 may be composed of a metal, such as copper, aluminum, tungsten, tantalum, titanium and combinations thereof. The electrically conductive fill material 74 may be formed using a deposition method, such as CVD or PVD. Examples of PVD methods suitable for forming the electrically conductive fill material 74 include sputtering, plating, electroplating, electroless plating, and combinations thereof. The electrically conductive fill material 74 may include, but is not limited to: tungsten, copper, aluminum, silver, gold and alloys thereof. Following deposition, the upper surface of the electrically conductive fill material may be planarized, e.g., planarized by chemical mechanical planarization (CMP), to produce the structure depicted in FIG. 10, in which the trench portion of the contact 75 is self-aligned to the metal line 10, and does not open the air gaps 20.

In a second embodiment, a sacrificial filler 85 is used between a lower interconnect conductor lines 10 after a dielectric etch back step and a permeable cap 86 is formed atop the interconnect structure. The next level interconnect is formed with vias 90 connecting to the lower interconnect level, wherein any misaligned portion of the vias is prevented from punching through by the permeable cap 86 and/or the underlying sacrificial fill material 85. The sacrificial fill material 85 is then removed through the permeable cap layer 86 to form an air gap 20 in the lower interconnect level. In this embodiment, any misaligned vias 90 in this structure are landed on the permeable hard mask 86, and hence does not punch through into the lower interconnect level or air gaps 20. Further details of this method are now described with reference to FIGS. 11-14.

Figure 11:
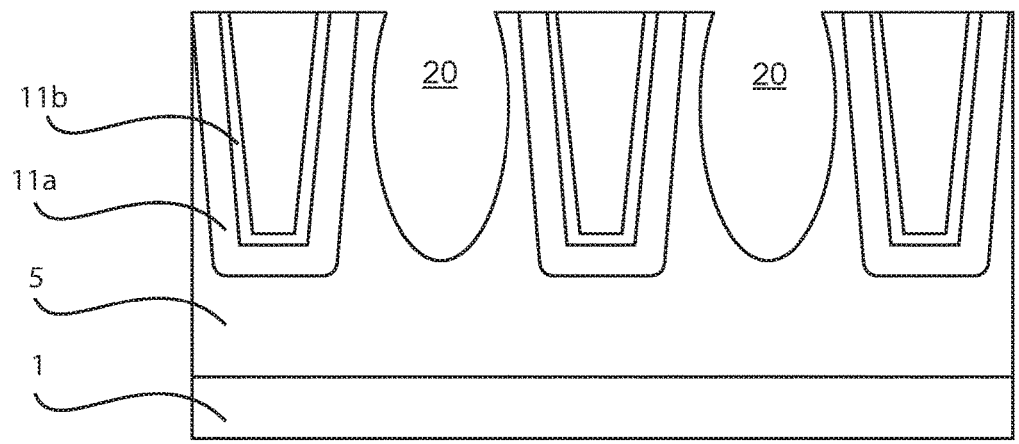
FIG. 11 is a side cross-sectional view depicting forming at least one air gap between adjacent metal lines in a plurality of metal lines, in accordance with one embodiment of the present disclosure.

FIG. 11 depicts forming at least one air gap 20 between adjacent metal lines 10 in a plurality of metal lines 10. The metal lines 10 depicted in FIG. 11 are similar to the metal lines 10 that are described above with reference to FIG. 1. Therefore, the description of the metal lines 10, e.g., their composition and method of forming, that has been provided above referencing the structures depicted in FIG. 1, is suitable for one embodiment of a metal line 10 as depicted in FIG. 11. For example, the metal lines 10 that are depicted in FIG. 11 may include a diffusion barrier liner 11*a*, a seed layer 11*b*, and an electrically conductive portion that provide the metal line. The metal lines 10 may be formed using a method that includes forming a plurality of line trenches in a low-k dielectric layer 5, forming a liner material 11*a*, 11*b* in the line trenches; and forming the plurality of metal lines 10 on the liner material 11*a*, 11*b* in the line trenches. The low-k dielectric material 5 that is depicted in FIG. 11 can be provided by the low-k dielectric layer 5 that is described above with reference to FIG. 1. The low-k dielectric material 5 may be present atop a substrate 1. Examples of substrates suitable for the embodiment described with reference to FIGS. 11-14 is also provided in the above description of FIG. 1.

The air gaps 20 may be formed in the low-k dielectric layer 5 between the adjacent metal lines 10 using an etch process, such as a wet chemical etch, or a dry etch, such as reactive ion etch or gas phase etching.

Figure 12:
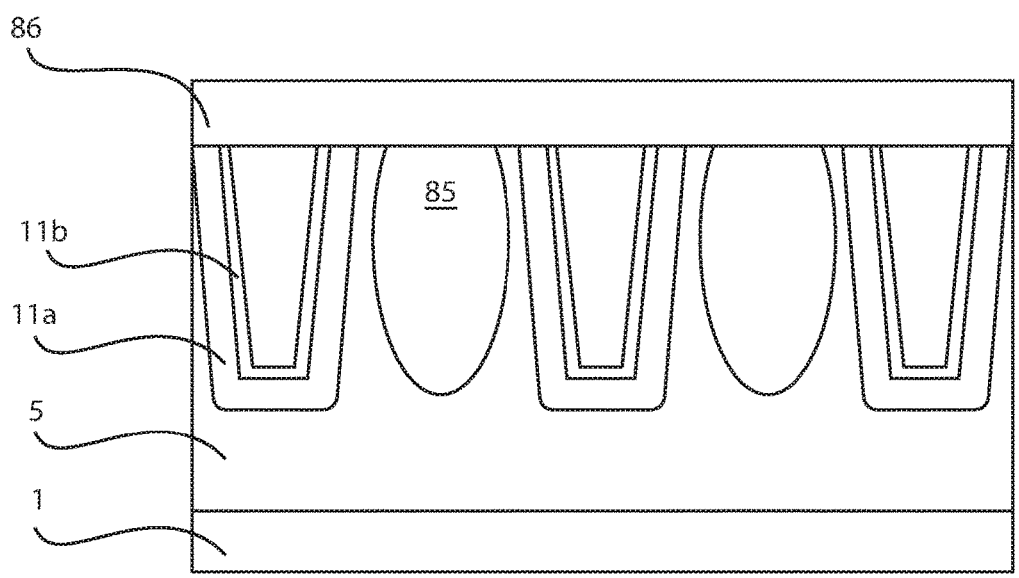
FIG. 12 is a side cross-sectional view depicting forming a sacrificial filler material within the at least one air gap, and forming a permeable cap dielectric atop the sacrificial filler material, in accordance with one embodiment of the present disclosure.

FIG. 12 depicts forming a sacrificial filler material 85 within the at least one air gaps 20, and forming a permeable cap dielectric 86 atop the sacrificial filler material 85. The sacrificial filler material 85 may be, but need not be, a dielectric. In some embodiments, the sacrificial filler material 85 will cleanly decompose within a time and temperature range, and in an atmosphere, which will not adversely affect the function of other structural components. In some embodiments, an acceptable decomposition temperature would be at or about 350° C.-450° C. Examples of suitable materials to function as a sacrificial layer include: polystyrenes; polymethyl methacrylates; polynorbornenes; and polypropylene glycols. Cross linking of the organics by UV or electron beam exposure has the benefit of rendering those temporary dielectric layers insoluble to organic solvents used during processing.

The sacrificial filler material 85 may be deposited using chemical vapor deposition (CVD), chemical solution deposition, and/or spin on deposition. The time period for depositing the sacrificial filler material 85 is selected to fill the air gaps 20. A planarization process may be applied to the upper surface of the sacrificial filler material 85 following deposition, such as chemical mechanical planarization, so that an upper surface of the sacrificial filler material 85 is coplanar with an upper surface of the low-k dielectric layer 5 and the metal lines 10, as depicted in FIG. 12.

FIG. 12 also depicts forming a permeable cap dielectric 86 atop the sacrificial filler material 85. The term "permeable" denotes that a solid material allows for the decomposing sacrificial filler material 85 to outgas through the permeable solid material. In some embodiments, the permeable cap dielectric 86 that is formed atop the sacrificial filler material 85 comprises crosslinked polyphenylenes, porous SiCOH, SiCOH, methyl silsesquioxane (MSSQ), crosslinked polyphenylenes or combinations. Examples of suitable materials to function as a permeable cap dielectric 86 include: HoSP and HoSP Best, products of Honeywell Electronic Materials; JSR 5140, JSR 2021, products of JSR Micro; SiCOH, polycarbonate or combinations of any of these materials, optionally arranged as a bi-layer. The permeable cap dielectric 86 is deposited using chemical vapor deposition (CVD), spin on deposition, or a combination thereof.

Figure 13:
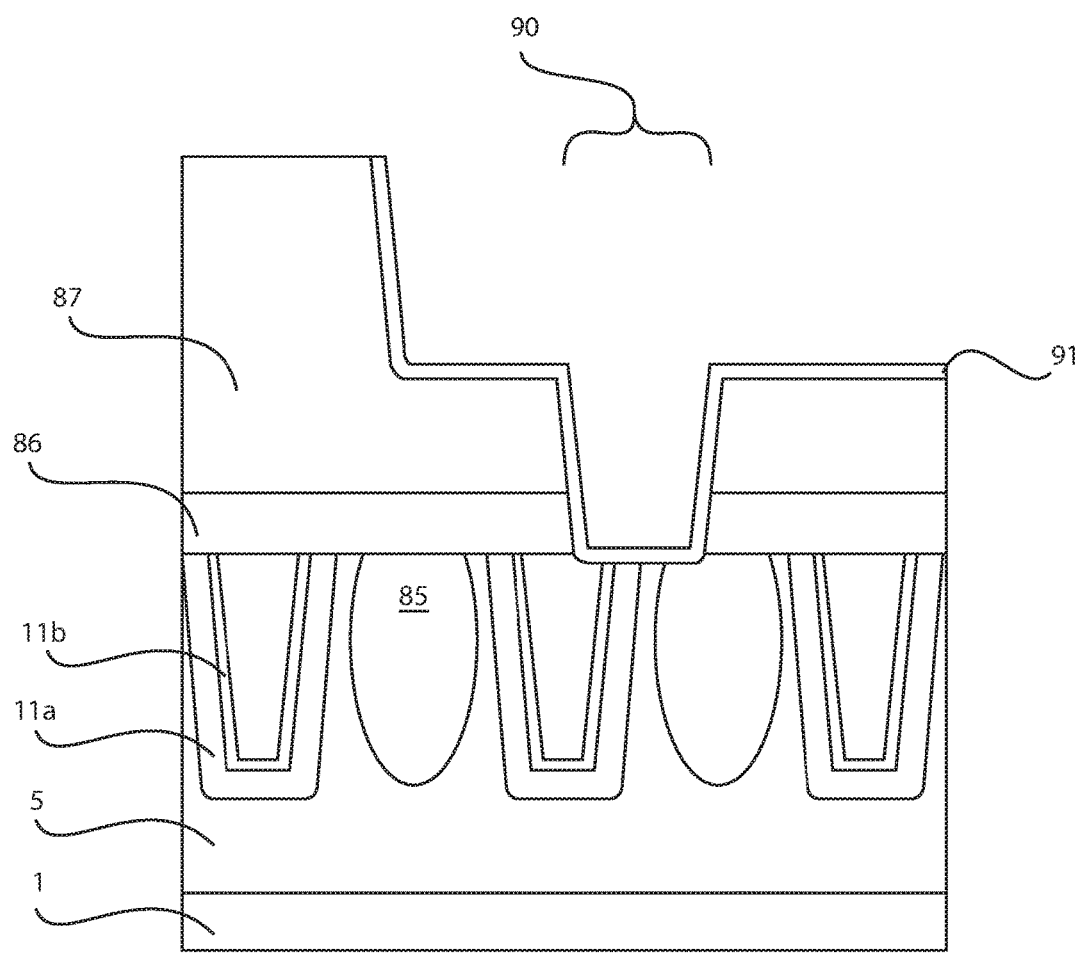
FIG. 13 is a side cross-sectional view depicting forming a trench for a contact on the structure depicted in FIG. 12.
Figure 14:
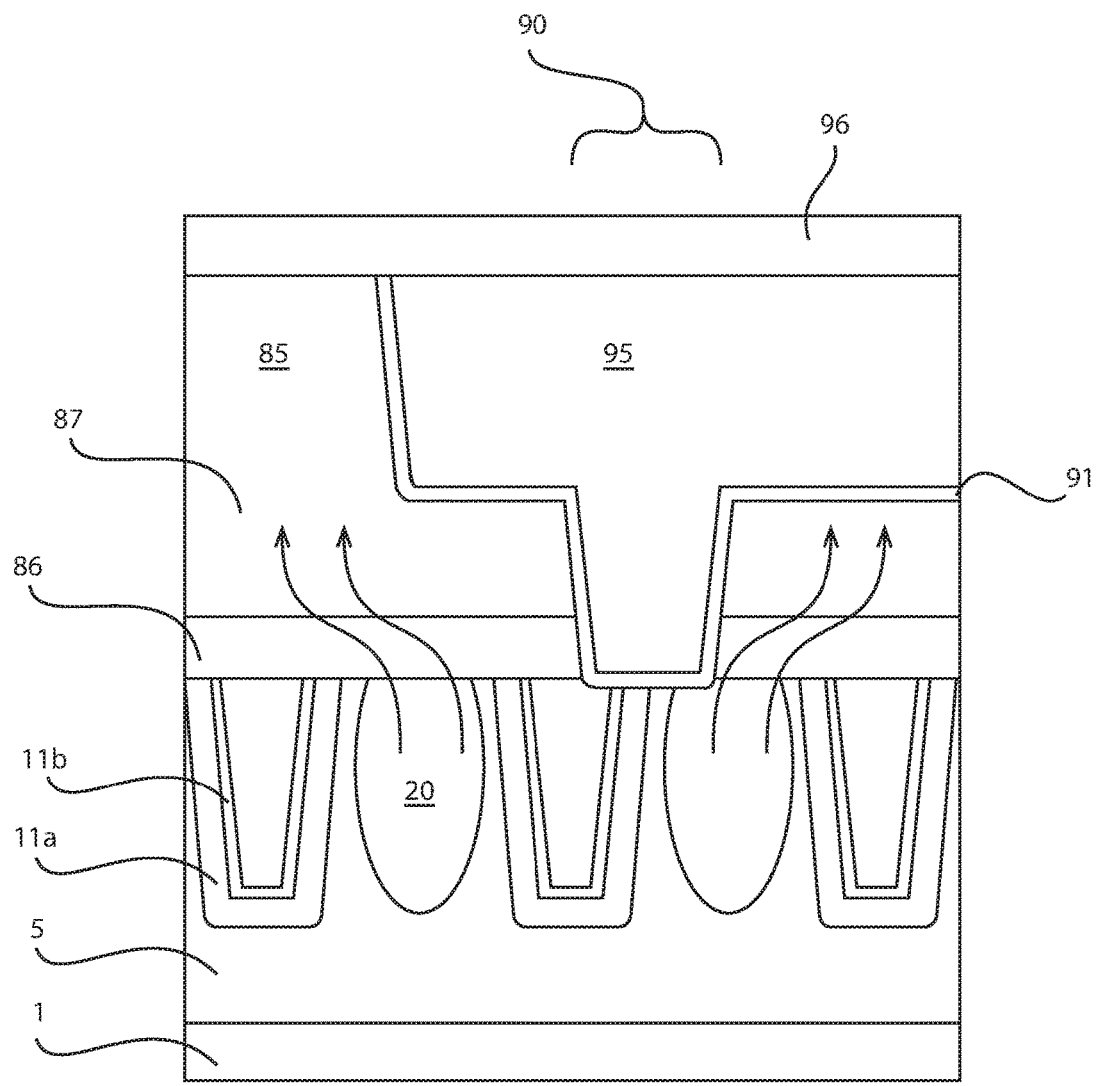
FIG. 14 is a side cross-sectional view depicting forming a contact to a metal line of the plurality of metal lines, and removing said sacrificial filler material, in accordance with one embodiment of the present disclosure.

FIGS. 13 and 14 depict forming a contact 91, 95 to a metal line 10 of the plurality of metal lines, wherein at least one of the permeable cap dielectric 86 and the sacrificial filler material 85 obstruct the contact from filling said at least one air gap 20.

FIG. 13 depicts forming an interlevel dielectric layer 87 over the permeable cap dielectric 86, patterning the interlevel dielectric layer 87 with an etch that is selective to at least one of the permeable cap dielectric 86 and the sacrificial filler material 85 to form a trench 90; and forming a trench liner material 91.

The interlevel dielectric layer 87 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer 87 include any of the aforementioned materials in porous form, or in a form that changes during processing to or from being porous and/or permeable to being non-porous and/or non-permeable.

Patterning the interlevel dielectric layer 87 with an etch that is selective to at least one of the permeable cap dielectric 86 and the sacrificial filler material 85 to form a trench 90 may employ photolithography and etch processes similar to those described above in the embodiments described with reference to FIGS. 1-10. In some embodiments, patterning of the interlevel dielectric layer etches through said permeable cap dielectric, but does not impact the integrity of the sacrificial filler material 85.

FIG. 14 depicts filling the trench 90 with an electrically conductive material to form a contact 91, 95 to a metal line of the plurality of metal lines, and removing said sacrificial filler material 85. The contact may include a trench liner 91 and an electrically conductive material fill 95.

The trench liner 91 may be a seed layer, diffusion barrier or adhesion layer that can be deposited using at least one of atomic layer deposition (ALD), chemical vapor deposition (CVD), plasma vapor deposition (PVD), pulsed nucleation layer (PNL), pulsed deposition layer (PDL), plasma-enhanced ALD and plasma-enhanced CVD. The trench liner 91 may be composed of a metal, such as copper, aluminum, tungsten, tantalum, titanium and combinations thereof.

The electrically conductive fill material 95 may be formed using deposition methods, such as CVD or PVD. Examples of PVD methods suitable for forming the electrically conductive fill material 95 include sputtering, plating, electroplating, electroless plating, and combinations thereof. The electrically conductive fill material 95 may include, but is not limited to: tungsten, copper, aluminum, silver, gold and alloys thereof. Following deposition, the upper surface of the electrically conductive fill material may be planarized, e.g., planarized by chemical mechanical planarization (CMP). A second interlevel dielectric layer 96 may be formed atop the planarized upper surface of the electrically conductive fill material FIG. 14 depicts removing the sacrificial filler material 85 from the air gaps 20. The sacrificial filler material 85 may be thermally decomposed into a gas, wherein the gas out diffuses from the air gap through the permeable cap dielectric 86. Thermal decomposition of the sacrificial filler material 85 may include annealing the structure depicted in FIG. 14 in a furnace having controlled, inert or vacuum atmosphere. The increase in temperature is slowly ramped to about 350° C. to 450° C. for a time sufficient to complete removal of the sacrificial filler material 85 and its decomposition by-products. The end point may be monitored using a mass spectrometer. The thermal decomposition method may continue until an entirety of the sacrificial filler material 85 has decomposed, leaving air dielectric, i.e., gaseous air, i.e., no solid material, in its place. The decomposition byproducts are gasified and diffuse through permeable hard permeable cap dielectric 86 and are removed by vacuum.

Figure 15:
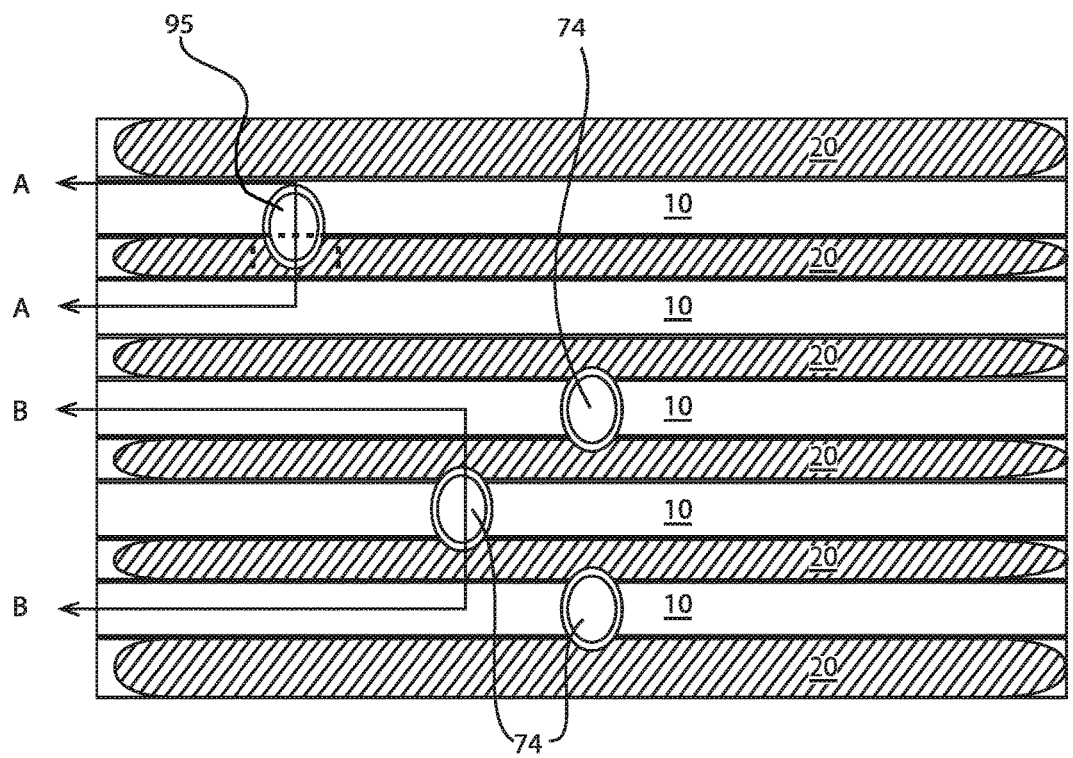
FIG. 15 is a top down view depicting an interconnect structure to metal lines separated by air gaps that does not include an exclusion zone, in accordance with one embodiment of the present disclosure.

FIG. 15 is a top down view depicting an interconnect structure to metal lines 10 separated by air gaps 20 that does not include an exclusion zone. An exclusion zone is an area in which a dielectric material is present between lines, i.e., completely filling the area between adjacent lines, in which the vias are formed to avoid the vias from entering an air gap. As depicted in FIG. 15, the entirety of the space separating adjacent metal lines are provided air gaps 20. FIG. 15 depicts an electrical device that includes a plurality of metal lines 10 in a region of a substrate positioned in an array of metal lines all having parallel lengths. FIG. 15 depicts a plurality of air gaps 20 between the metal lines 10 in a same level as the metal lines, wherein an air gap 20 is present between each set of adjacent metal lines. FIG. 15 further depicts a plurality of interconnects 74, 95 in electrical communication with said plurality of metal lines 10, wherein an exclusion zone for the plurality of interconnects 74, 95 is not present in said array of metal lines 10.

The cross section depicted by section line A-A illustrates the embodiment described above with reference to FIGS. 11-14. In this embodiment, the plurality of interconnects 95 in electrical communication with said plurality of metal lines 19 includes interconnects that are present extending over an air gap 20, but does not extend into the air gap 20, as depicted in FIG. 14. In this embodiment, the bottom surface of the interconnect 91, 95 provides a portion of an upper surface of the air gap 20. In some embodiments, a permeable dielectric cap 86 is adjacent to the bottom surface of the interconnect 91, 95 and provides an abutting upper surface of the air gap adjacent 20 to the upper surface of the air gap 20 provided by the interconnect. The cross section depicted by section line B-B illustrates the embodiment described above with reference to FIGS. 1-10. In this embodiment, the plurality of interconnects 73, 74 are self-aligned to the plurality of metal lines 10.

Having described preferred embodiments of systems, apparatuses and devices including an electrical fuse (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
    a plurality of electrically conductive lines on a substrate that are positioned in an array having parallel lengths;
    a plurality of air gaps between the plurality of electrically conductive lines in a same level as the plurality of electrically conductive lines, wherein an air gap is present between each set of adjacent electrically conductive lines, and each air gap includes a sidewall including at least one curvature;
    first and second portions of a permeable dielectric material disposed directly on the plurality of electrically conductive lines and the plurality of air gaps and each having a top surface at a substantially same height throughout an entirety of the first and second portions; and
    at least one interconnect in electrical communication with a corresponding one of the plurality of electrically conductive lines and having a bottom surface adjacent to the first and second portions of the permeable dielectric material, the at least one interconnect including:
        a first region disposed on a second region having different widths;
        the second region extending over a corresponding one of the plurality of air gaps such that a bottom surface of the at least one interconnect provides a first portion of an upper surface of the corresponding air gap, and a bottom surface of the second portion of the permeable dielectric material provides a second portion of the upper surface of the corresponding air gap;
        an adhesion layer that extends into only an upper portion of the corresponding air gap; and
        an electrically conductive fill within the first and second regions that is obstructed from extending into the corresponding air gap by the adhesion layer so that the electrically conductive fill cannot extend into a lower portion of the corresponding air gap.

2. The electrical device of claim 1, wherein the permeable dielectric material is selected from the group consisting of crosslinked polyphenylenes, porous SiCOH, SiCOH, methyl silsesquioxane (MSSQ), and combinations thereof.

3. The electrical device of claim 1, wherein a pitch separating adjacent electrically conductive lines in the plurality of electrically conductive lines ranges from 30 nm to 80 nm.

4. The electrical device of claim 1, wherein the plurality of electrically conductive lines are comprised of a doped semiconductor material.

5. The electrical device of claim 1, wherein the plurality of electrically conductive lines are comprised of a metal.

6. The electrical device of claim 5, wherein the metal is selected from the group consisting of copper, silver, platinum, aluminum, gold, tungsten and combinations thereof.

7. The electrically device of claim 5, wherein the metal of the plurality of electrically conductive lines is present in trenches in a low-k dielectric material.

* * * * *